US006320397B1

(12) United States Patent
Wood et al.

(10) Patent No.: US 6,320,397 B1
(45) Date of Patent: *Nov. 20, 2001

(54) MOLDED PLASTIC CARRIER FOR TESTING SEMICONDUCTOR DICE

(75) Inventors: Alan G. Wood, Boise; Warren M. Farnworth, Nampa; David R. Hembree, Boise, all of ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/614,735

(22) Filed: Mar. 13, 1996

Related U.S. Application Data

(63) Continuation of application No. 08/398,309, filed on Mar. 1, 1995, now Pat. No. 5,519,332, which is a continuation-in-part of application No. 08/345,064, filed on Nov. 14, 1994, now Pat. No. 5,541,525, which is a continuation-in-part of application No. 08/124,899, filed on Sep. 21, 1993, now Pat. No. 5,495,179, which is a continuation-in-part of application No. 08/046,675, filed on Apr. 14, 1993, now Pat. No. 5,367,253, which is a continuation-in-part of application No. 07/973,931, filed on Nov. 10, 1992, now Pat. No. 5,302,891, which is a continuation of application No. 07/709,858, filed on Jun. 4, 1991, now abandoned.

(51) Int. Cl.⁷ .............................. G01R 1/073; G01R 31/02
(52) U.S. Cl. .......................... 324/755; 324/754; 324/765
(58) Field of Search ................................ 324/755, 754, 324/765, 537; 439/66, 68

(56) References Cited

U.S. PATENT DOCUMENTS

| | | | |
|---|---|---|---|
| 4,169,642 | * 10/1979 | Mouissie | ............................... 439/66 |
| 4,783,719 | * 11/1988 | Jamison et al. | .................... 324/537 |
| 5,519,332 | * 5/1996 | Wood et al. | ...................... 324/755 |
| 5,781,022 | 7/1998 | Wood et al. . | |
| 5,815,000 | 9/1998 | Farnworth et al. . | |
| 5,844,418 | 12/1998 | Wood et al. . | |
| 5,878,485 | 3/1999 | Wood et al. | ........................ 29/825 |
| 5,896,036 | 4/1999 | Wood et al. . | |
| 5,945,834 | * 8/1999 | Nakata et al. | ..................... 324/754 |
| 6,091,250 | 7/2000 | Wood et al. . | |
| 6,091,251 | 7/2000 | Wood et al. . | |
| 6,094,058 | 7/2000 | Hembree et al. . | |

* cited by examiner

*Primary Examiner*—Ernest Karlsen
(74) *Attorney, Agent, or Firm*—Stephen A. Gratton

(57) ABSTRACT

A carrier for testing an unpackaged semiconductor die is provided. The carrier includes a carrier base for supporting the die; an interconnect for establishing a temporary electrical connection with the die; and a force distribution mechanism for biasing the die and interconnect together. In an illustrative embodiment the carrier is formed with a laminated ceramic base. The ceramic base includes internal conductive lines that are wire bonded to the interconnect and metal plated external contacts that are connected to external test circuitry. In an alternate embodiment the carrier is formed with an injection molded plastic base and includes 3-D circuitry formed by a metallization and photolithographic process. In either case, the carrier is adapted for testing different die configurations by interchanging different interconnects.

22 Claims, 5 Drawing Sheets

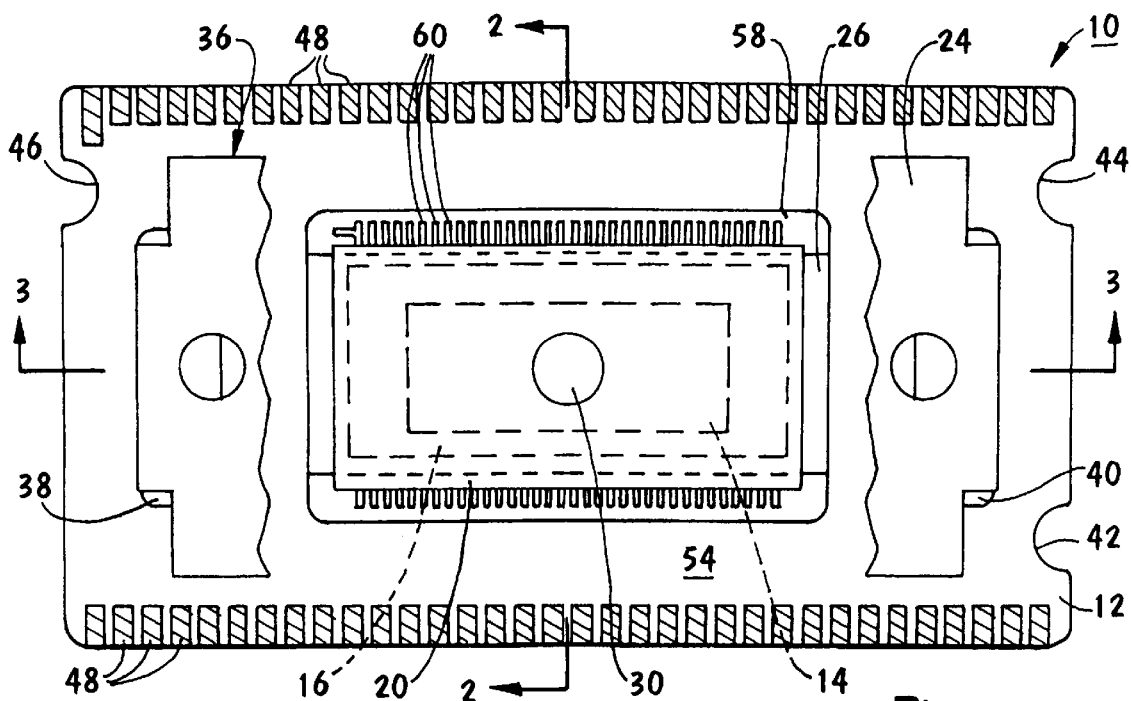
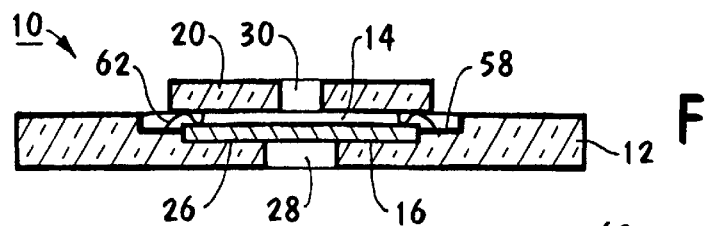
Figure 2
Figure 2A
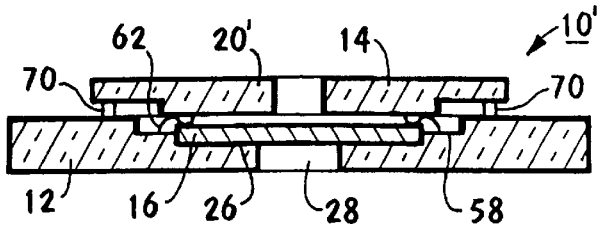
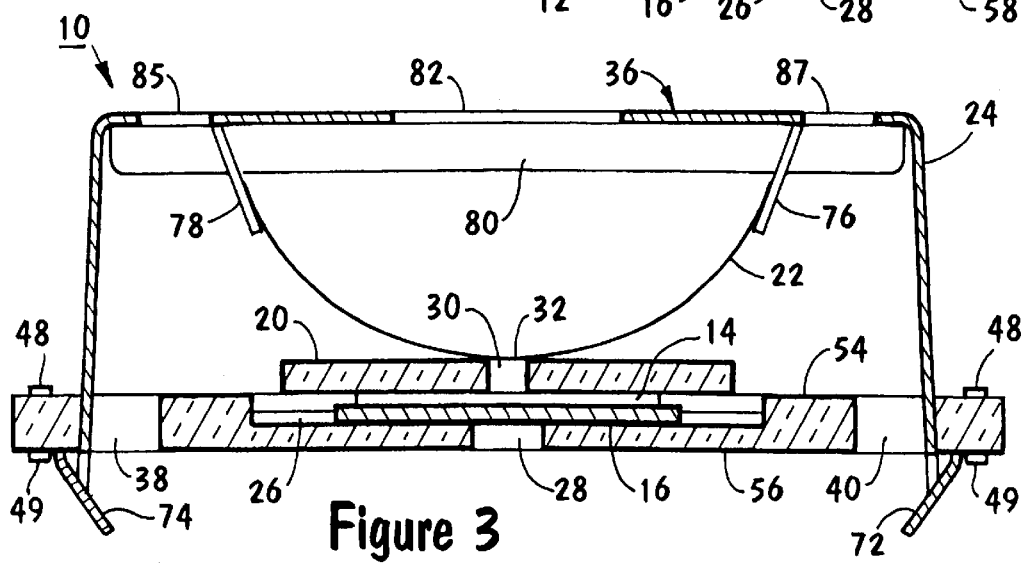
Figure 3

MOLDED PLASTIC CARRIER FOR TESTING SEMICONDUCTOR DICE

CROSS REFERENCE TO RELATED APPLICATIONS

This application is a continuation of application Ser. No. 08/398,309 filed Mar. 1, 1995 U.S. Pat. No. 5,519,332, which is a continuation-in-part of application Ser. No. 08/345,064 filed Nov. 14, 1994 U.S. Pat. No. 5,541,525 , which is a continuation-in-part of application Ser. No. 08/124,899 filed Sep. 21, 1993 U.S. Pat. No. 5,495,179 , which is a continuation-in-part of application Ser. No. 08/046,675, filed Apr. 14, 1993 U.S. Pat. No. 5,367,253, which is a continuation-in-part of application Ser. No. 07/973,931 filed on Nov. 10, 1992, U.S. Pat. No. 5,302,891, which is a continuation of application Ser. No. 07/709,858, filed Jun. 4, 1991, abandoned.

This application is related to applications Ser. No. 07/788,065 filed Nov. 5, 1991 U.S. Pat. No. 5,440,240 ; Ser. No. 07/953,750 filed Sep. 29, 1992 now abandoned; Ser. No. 08/073,005 filed Jun. 7, 1993 U.S. Pat. No. 5,408,190; Ser. No. 08/073,003 filed Jun. 7, 1993 now abandoned; Ser. No. 08/120,628 filed Sep. 13, 1993 now abandoned; Ser. No. 07/896,297 filed Jun. 10, 1992 U.S. Pat. No. 5,424,652; Ser. No. 08/192,391 filed Feb. 3, 1994 U.S. Pat. No. 5,483,174; and, Ser. No. 08/137,675 filed Oct. 14, 1993 now abandoned.

FIELD OF THE INVENTION

This invention relates to semiconductor manufacture and more particularly to a carrier suitable for holding and establishing electrical communication with an unpackaged semiconductor die. The carrier is useful in the manufacture and testing of known good semiconductor die (KGD).

BACKGROUND OF THE INVENTION

One of the fastest growing segments of the semiconductor industry is the manufacture of multi-chip modules (MCM). Multi-chip modules are being increasingly used in computers to form PC chip sets and in telecommunication items such as modems and cellular telephones. In addition, consumer electronic products such as watches and calculators typically include multi-chip modules.

With a multi-chip module, non-encapsulated or unpackaged dice (i.e., chips) are secured to a substrate (e.g., printed circuit board) using an adhesive. Electrical connections are then made directly to the bond pads on each die and to electrical leads on the substrate. In general, unpackaged dice cost less to manufacture than the equivalent packaged products. This is because the procedures for packaging semiconductor dice are complex and costly. Substantial cost savings are realized by eliminating packaging procedures.

However, because there is no package, procedures for testing the unpackaged dice are more difficult than test procedures for packaged dice. With unpackaged dice semiconductor manufacturers are required to supply dice that have been tested and certified as known good die (KGD). Known-good-die (KGD) is a collective term that connotes unpackaged die having the same quality and reliability as the equivalent packaged product. This has led to a need in the art for manufacturing processes suitable for testing bare or unpackaged semiconductor die.

For test and burn-in of an unpackaged dice, a carrier replaces a conventional single chip package in the manufacturing process. The carrier typically includes an interconnect that allows a temporary electrical connection to be made between external test circuitry and the die. In addition, such a carrier must allow the necessary test procedures to be performed without damaging the die. The bond pads on a die are particularly susceptible to physical damage during the test procedure.

In response to the need for known good die (KGD), semiconductor manufacturers have developed carriers for testing unpackaged die. As an example, carriers for testing unpackaged die are disclosed in U.S. Pat. No. 4,899,107 to Corbett et al. and U.S. Pat. No. 5,302,891 to Wood et al., which are assigned to Micron Technology, Inc. Other test apparatus for unpackaged die are disclosed in U.S. Pat. No. 5,123,850 to Elder et al., and U.S. Pat. No. 5,073,117 to Malhi et al., which are assigned to Texas Instruments.

One of the key design considerations for a carrier is the method for establishing a temporary electrical connection with the bond pads on the die. With some carriers, the die is placed circuitry side down in the carrier and biased into contact with the interconnect. The interconnect contains the contact structure that physically aligns with and contacts the bond pads of the die. Exemplary contact structures include wires, needles, and bumps. The mechanisms for making electrical contact include piercing the native oxide of the bond pad with a sharp point, breaking or burnishing the native oxide with a bump, or moving across the bond pad with a contact adapted to scrub away the oxide. In general, each of these contact structures is adapted to form a low-resistance ohmic contact with the bondpad. Low-resistance refers to a resistance that is negligible. An ohmic contact is one in which voltage appearing across the contact is proportional to current flowing for both directions of flow.

Other design considerations for a carrier include electrical performance over a wide temperature range, thermal management, power and signal distribution, the cost and reusability of the carrier, and the ability to remove and replace the temporary interconnect. In addition, a carrier should be suitable for use with automated equipment and assembly procedures utilized in high volume semiconductor manufacture.

In view of the foregoing, it is an object of the present invention to provide an improved carrier adapted to test and burn-in an unpackaged die without damage to the die. It is a further object of the invention to provide an improved carrier for testing an unpackaged die, that is reusable, that is easy to assemble and disassemble, that provides efficient electrical coupling to contact locations on a die over a wide temperature range, and that can be used for testing different types of dice using a removable and reusable interconnect. It is yet another object of the present invention to provide an improved carrier that does not include protruding mechanical pins or leads. Other objects, advantages, and capabilities of the present invention will become more apparent as the description proceeds.

SUMMARY OF THE INVENTION

In accordance with the present invention, a carrier for testing a discrete, unpackaged semiconductor die is provided. The carrier is adapted to retain a die under test (DUT) and provide a temporary electrical connection between the die and external test circuitry. This enables burn-in and other test procedures to be performed on the die. In an illustrative embodiment, the carrier includes a multi-layer ceramic base having internal conductive lines and metal plated external contacts. In an alternate embodiment the carrier includes a molded plastic base having plated metallic 3-D conductive lines and external contacts. With either embodiment the carrier is formed without protruding mechanical pins or leads that can be easily damaged.

Both carrier embodiments include a temporary interconnect mountable on the base for establishing a temporary electrical connection to the die under test. In addition, a force distribution mechanism is provided for biasing the die and interconnect together. The force distribution mechanism includes a bridge clamp, a spring and a pressure plate. All of the elements of the carrier are reusable and are designed to permit reusability and easy assembly/disassembly of the carrier and die.

The temporary interconnect for the carrier is formed in a configuration which accommodates a particular die bondpad configuration. This permits different types of interconnects to be interchangeable to allow testing of the different types of semiconductor dice using a universal carrier. The temporary interconnect includes raised contact members for penetrating into contact locations (e.g., bond pads, test pads) on the die. A pattern of conductive traces is formed on the interconnect in electrical communication with the contact members. Each conductive trace includes a contact pad, which in the assembled carrier, are used to establish an electrical path to the external contacts on the carrier using wire bonding or a mechanical connection.

For assembling the carrier with a die, a temporary interconnect having a configuration of contact members corresponding to the bond pads on the die is selected and placed on a mounting surface formed on the carrier base. An electrical path is then established between the contact members on the interconnect and the external contacts on the carrier base by we bonding or other electrical connection (e.g., clips). During the assembly procedure, the die is initially attached to the force distribution mechanism, typically using a vacuum. Next, the die and temporary interconnect are optically aligned using a vision system, and the die is placed into abutting contact with the temporary interconnect with a controlled or predetermined force. This causes the contact members on the interconnect to penetrate into the contact locations on the die and establish an electrical connection. At the same time, the force distribution mechanism is attached to the carrier base to bias the die and interconnect together. The external contacts on the assembled carrier are then attached to test circuitry using a socket or other connection and the die is tested using suitable test equipment (e.g., burn-in oven and test equipment). Following the test procedures, the carrier is disassembled and the tested die is removed from the carrier.

The bar code can also be used to track what insert (interconnect) is mounted in the carrier and the number of cycles a particular insert has undergone. Also, since different inserts can be accommodated in the carrier, the bar code can be used to tell what type of interconnect (i.e., die type) a particular carrier is configured for.

The carrier can include provision for identifying the carrier with a bar code. This permits each die and carrier to be tracked through the burn-in and test procedure. In addition, the carrier can include a sealing member to prevent contamination of the die during testing and an indicator of the orientation of the die and carrier.

BRIEF DESCRIPTION OF THE DRAWING

FIG. 1 is a plan view partially cut away of a carrier constructed in accordance with the invention with a laminated ceramic base;

FIG. 2 is a cross sectional view taken along section line 2—2 of FIG. 1;

FIG. 2A is a cross sectional view equivalent to FIG. 2 of a carrier formed with a sealing member component;

FIG. 3 is a cross sectional view taken along section line 3—3 of FIG. 1 but with a force distribution component of the carrier included in the view;

DETAILED DESCRIPTION OF THE PREFERRED EMBODIMENT

Figure 4:
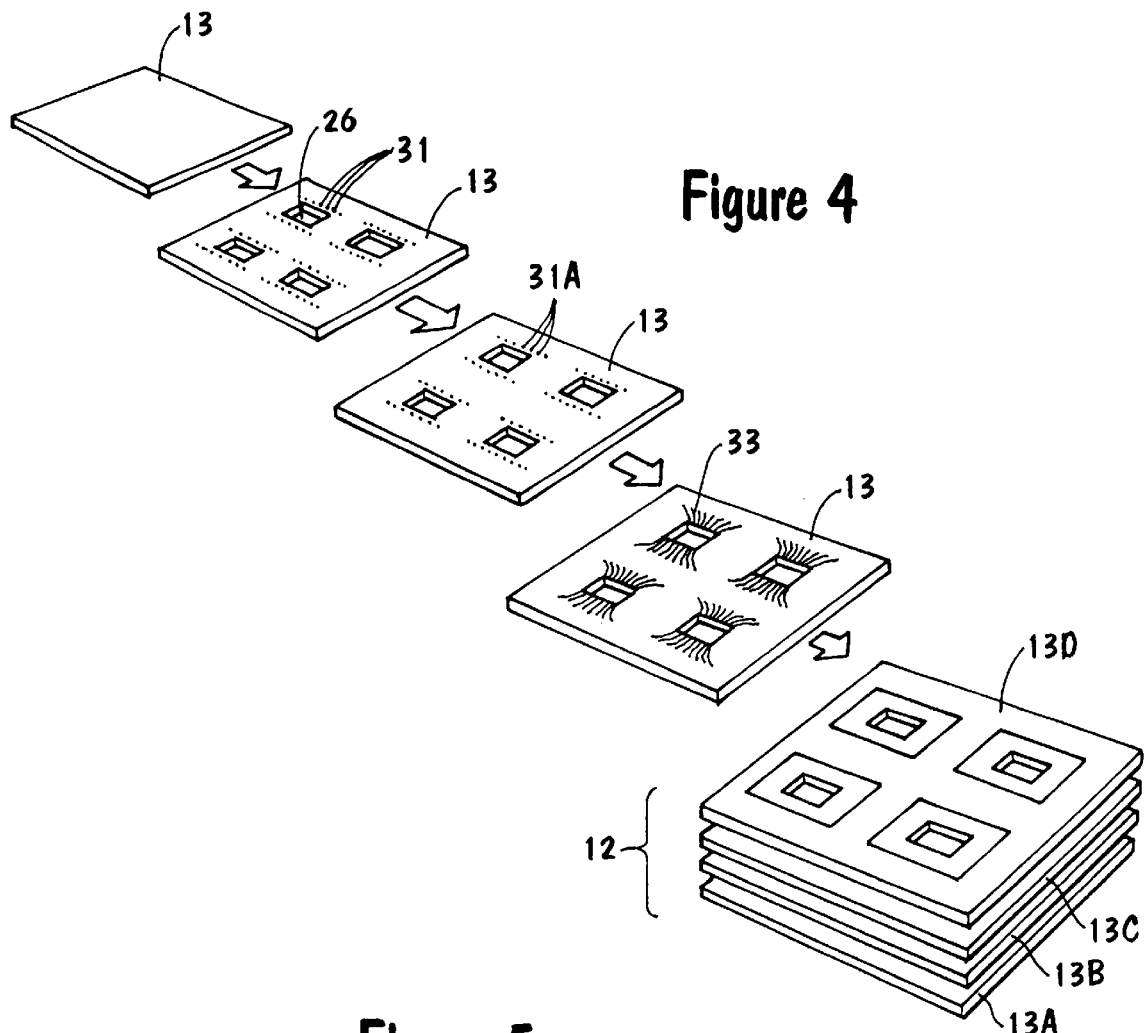
FIG. 4 is a schematic view illustrating a process sequence for forming a laminated ceramic base.

Referring now to FIGS. 1–3, a carrier 10 constructed in accordance with the invention is shown.

The carrier 10, generally stated, includes:

a carrier base 12 adapted to retain a die 14 for testing;

a temporary interconnect 16 adapted to establish electrical communication between the die 14 and test circuitry (test circuitry not shown); and a force distribution mechanism 36 comprising a pressure plate 20, a spring 22 (FIG. 3) and a bridge clamp 24 (FIG. 3) for biasing the die 14 against the interconnect with an evenly distributed biasing force.

In the assembled carrier 10, the interconnect 16 fits within the carrier base 12 and is wire bonded to the carrier base 12. The die 14 is placed face down (i.e., bond pad side down) on the interconnect 16. The die 14 is retained and biased into engagement with the interconnect 16 by the force distribution mechanism 36. The assembled carrier base 12 is designed to be placed in a burn-in oven (not shown) or other test fixture for testing the die 14. The burn-in oven typically includes a socket or printed circuit board (PCB) for effecting the electrical connection to external test circuitry.

The carrier base 12 includes a cavity 26 for retaining the die 14 and interconnect 16. An adhesive can be used to positively secure the interconnect 16 to the carrier base 12. In addition, the carrier base 12 includes an opening 28 to facilitate installation and removal of the interconnect 16. As shown in FIG. 1, the carrier base 12 also includes radiused cutouts 42, 44, 46 formed along the sidewalls 100 and 102 respectively. The cutouts 42, 44, 46 along with the overall peripheral shape and thickness of the carrier base 12 facilitate handling using automated handling apparatus such as trays, magazines and robots.

The carrier base 12 also includes a pattern of external contact pads 48 formed on an upper surface 54 and a pattern of external contact pads 49 formed on a lower surface 56 of the carrier base 12. Each external contact pads 48 on the upper surface 54 has a mating contact pad 49 on the lower surface 56. The mating pairs of contact pads 48, 49 are formed along the longitudinal edges of the carrier base 12. As will be more fully explained, the mating pairs of contact pads 48, 49 are electrically connected by internal metallization. They can also be connected externally by traces running down a side of the carrier. The external contact pads 48, 49 are adapted to be contacted by a mechanical connector such as a spring clip (e.g., clips 68-FIG. 8) for establishing an electrical connection to external test circuitry. The external contact pads 48, 49 can be formed of a refractory metal or a metal alloy (e.g., gold/nickel) to insure a low resistance electrical connection.

In addition, the carrier base 12 includes a pair of slotted through openings 38, 40 for retaining the bridge clamp 24 of the force distribution mechanism 36. Additionally, the carrier base 12 includes a bond shelf 58 formed within the cavity 26. A pattern of bond pads 60 are formed on the bond shelf 58. Each bond pad 60 is electrically connected by internal metallization to a corresponding pair of external contact pads 48, 49. The bond pads 60 provide an attachment point for wires 62 (FIG. 2) that are wire bonded to the bond pads 60 and to mating bond pads 64 (FIG. 5) formed on the interconnect 16. This establishes an electrical pathway from the external contact pads 48, 49 on the carrier base 12 through the interconnect 16 and to contact location on the die 14. Alternately, other means for establishing an electrical path from the carrier base 12 through the interconnect can be employed. By way of example, in place of wire bonding, some type of mechanical connection such as clips, or slide contacts can be used to connect the interconnect 16 to the carrier base 12.

In the illustrative embodiment, the carrier base 12 is a multi layer block formed of a fired laminated ceramic material such as alumina ($Al_2O_3$). A ceramic carrier base 12 can be formed using a high temperature ceramic lamination process. Such a process is shown in FIG. 4. Initially, green sheets 13 of unsintered flexible raw ceramic are cut to size to form several carrier bases 12 (e.g., four). Next, via holes 31 and other inside features as required (e.g., cavity 26) are punched through the green sheets 13. Next, the via holes 31A are either filled or coated with a conductive material (e.g., tungsten paste) to provide an interlevel connection between the different layers in the laminated carrier base 12. Next, a screen printing process is used to print a metallized pattern of conductive lines 33 (or conductive planes) on selected green sheet surfaces. In this case, the conductive lines 33 will be located within the carrier base 12 (i.e., internal) and provide a conductive path between the external contact pads 48 and 49 (FIG. 1) and a conductive path between the bond pads 60 (FIG. 1) and the contact pads 48 and 49. The conductive lines 33 can be formed of a refractory metal such as tungsten. Several green sheets 13A, 13B, 13C, 13D formed as required, are then stacked in the required sequence and bonded together. The different green sheets 13A, 13B 13C, 13D, (some containing metallization patterns as required), are then sintered at elevated temperature (1500° C.–1600° C.) in a reducing atmosphere. This is followed by a plating process to form the external contact pads 48, 49 (FIG. 1) and bond pads 60 (FIG. 1) out of a suitable metal (e.g., gold with nickel underplating). The plating process can include electrolytic or electroless deposition followed by resist coating, exposure, development, and selective wet chemical etching. Next, cutting or punching operations are performed to define the peripheral dimensions of the carrier base 12.

Referring back again to FIG. 3, the force distribution mechanism 36 will be explained in detail. The force distribution mechanism 36 includes the pressure plate 20, spring 22 and bridge clamp 24. The pressure plate 20 is a rigid plate having an outer peripheral configuration that is larger than the outer peripheral configuration of the die 14. In addition to evenly distributing the load exerted by the spring 22 of the force distribution mechanism 36, the pressure plate 20 can also function to dissipate heat generated by the die 14 during testing. The pressure plate 20 can be formed of a heat absorbing and reflecting material such as ceramic or molded plastic. Alternately, the pressure plate 20 can be formed of a metal such as stainless steel. The pressure plate 20 includes an opening 30 which is used in the assembly of the carrier 10. As will be further explained, the opening 30 is used in conjunction with a vacuum assembly tool 34 (FIG. 10) for aligning the die 14 and pressure plate 20 with the interconnect 16.

Figure 10:
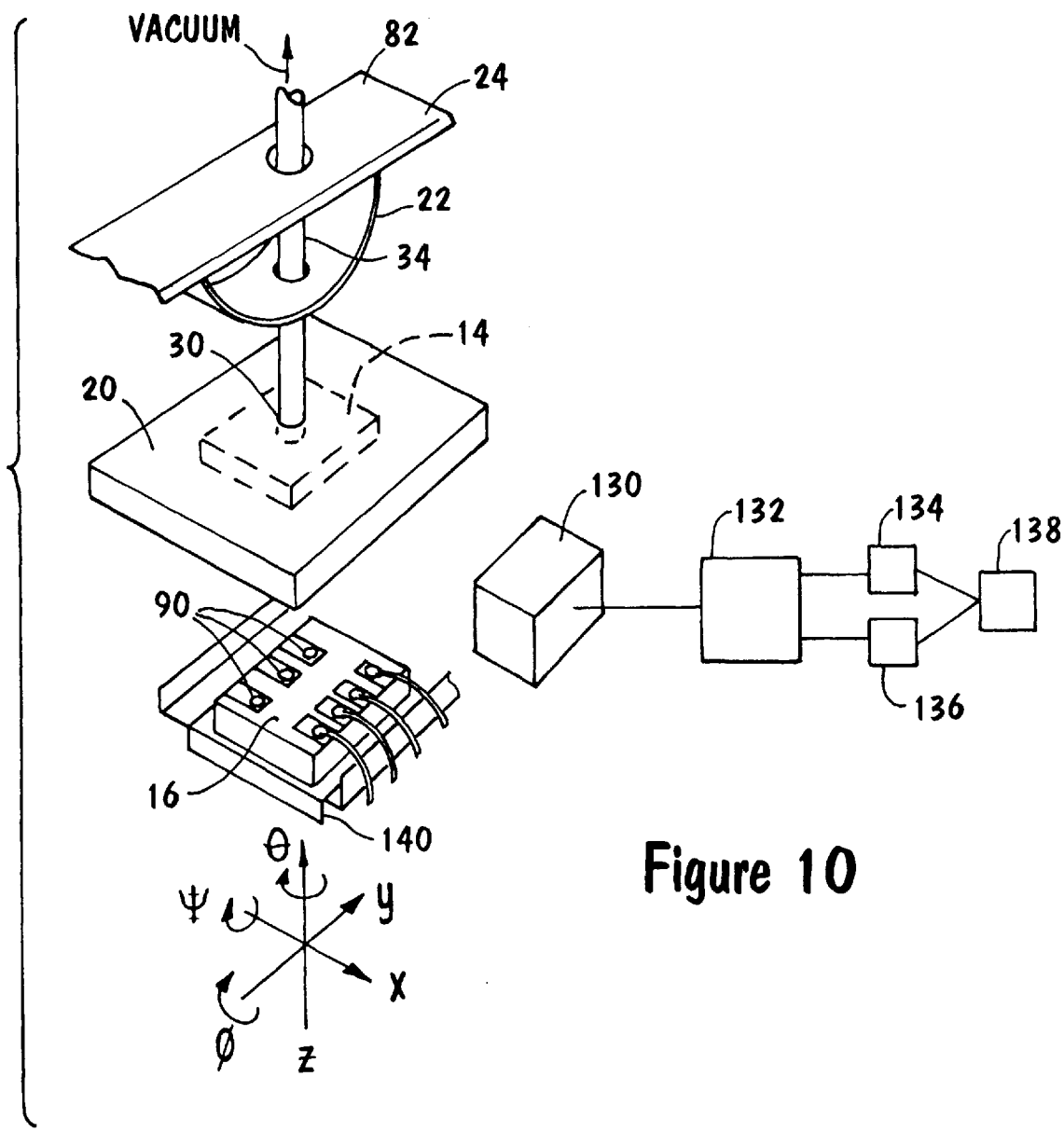
FIG. 10 is a schematic view illustrating an assembly procedure for aligning a die to be tested with the interconnect component of the carrier.

The spring 22 of the force distribution mechanism 36 is formed of an elastically resilient material such as spring steel. The spring 22 is sized and shaped to exert a predetermined spring force on the pressure plate 20. This force is evenly distributed by the pressure plate 20 over the back surface of the die 14 and biases the die 14 against the interconnect 16. The spring 22 also includes an opening 32 that aligns with the opening 30 in the pressure plate 20. As with opening 30, the opening 32 in the spring 22 permits access for the assembly tool 34 (FIG. 10).

Still referring to FIG. 3, the bridge clamp 24 is a flexible structure formed of a resilient material such as steel. The bridge clamp 24 includes mounting tabs 72, 74 adapted to engage the lower surface 56 of the carrier base 12. During the assembly procedure the mounting tabs 72, 74 are placed through the slotted openings 38, 40 in the carrier base 12. In the assembled carrier 10, the structure of the mounting tabs 72, 74 and the bridge clamp 24 under tensioning from the spring 22 cooperate to secure the bridge clamp 24 to the base 12. This arrangement also functions to secure the die 14 within the carrier base 12 and to bias the die 14 and interconnect 16 together with a predetermined force.

The bridge clamp 24 also includes downwardly extending tabs 76, 78 for attaching the spring 22 to the bridge clamp 24 by physical contact or a fastening mechanism such as spot welds. The longitudinal upper edges of the bridge clamp 24 are bent at a 90° angle to form stiffener members 80 on either side. In addition, a central opening 82 is formed in the bridge clamp 24 as an access opening for the vacuum assembly tool 34 (FIG. 10). Furthermore, openings 85, 87 are formed through the bridge clamp 24 for locating the bridge clamp with the assembly tool 34 (FIG. 10).

In an alternate carrier embodiment 10' shown in FIG. 2A, a sealing member 70 is interposed between the pressure plate 20' and the base 12'. The sealing member 70 functions to prevent particulate contamination of the die 14 during the test procedure. The sealing member 70 can be formed of a relatively soft material such as silicone deposited on the base 12'. Alternately the sealing member 70 can be formed as a separate gasket out of a flexible material such as rubber. The base 12' can also be formed with a ridge or an indentation for retaining the sealing member 70.

Figure 5:
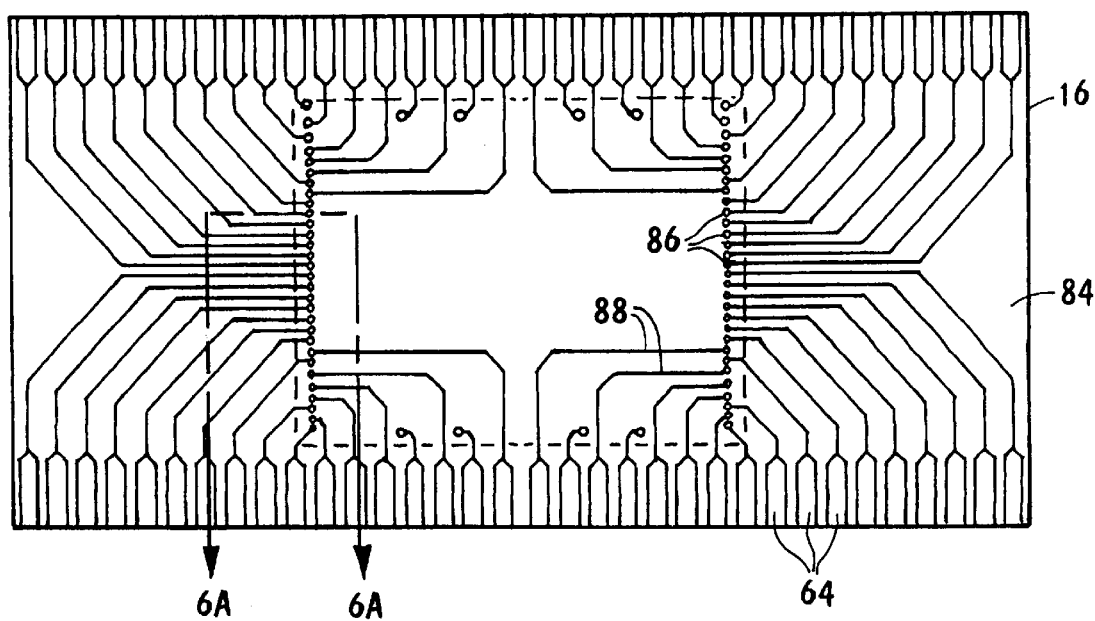
FIG. 5 is a plan view of an interconnect component for a carrier constructed in accordance with the invention with a semiconductor die superimposed thereon.
Figure 6A:
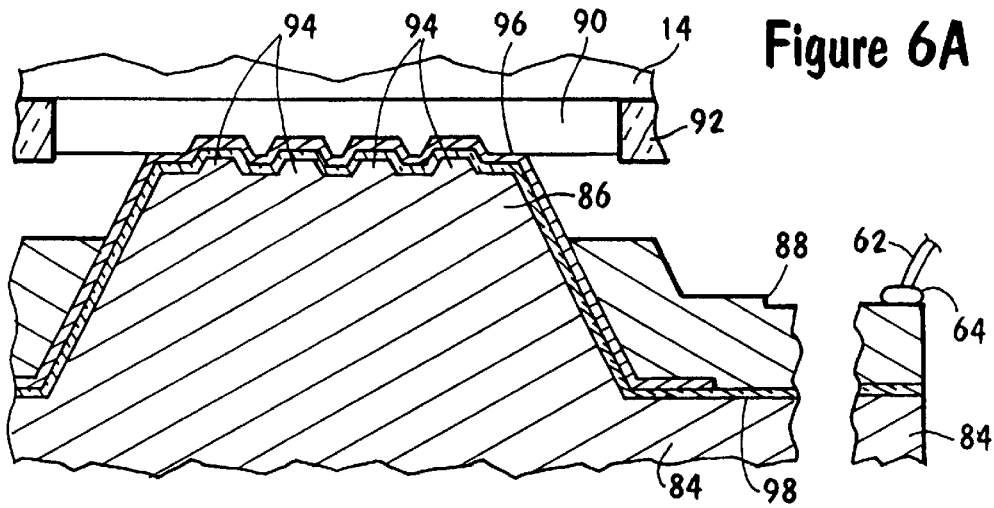
FIG. 6A is an enlarged cross sectional view taken along section line 6A—6A of FIG. 5 showing a raised contact member of the interconnect electrically engaging the die.

Referring now to FIGS. 5 and 6, details of the temporary interconnect 16 are shown. The interconnect 16 includes a substrate 84 formed of silicon and having raised contact members 86. Each contact member 86 is connected to an electrically conductive trace 88 adapted to conduct electrical signals to and from the contact members 86. The bond pads 64 are formed at the terminating ends of the conductive traces 88. In the illustrative embodiment of the interconnect 16, the interconnect bond pads 64 are situated along the longitudinal edge of the rectangular shaped interconnect 16. Alternately the bond pads 64 could be located along the lateral edge of the interconnect 16 on all four sides.

The contact members 86 on the interconnect 16 are spaced in a pattern that corresponds to the placement of the device bond pads 90 (FIG. 6) on the die 14. As shown in FIG. 6, the raised contact members 86 are adapted to contact the bond pads 90 of the die 14 and form an electrical connection that is low resistance and ohmic. The interconnect 16 shown in FIG. 3 is for a die having bond pads 90 embedded in insulating layer 92 and formed along each end (i.e., end connect). Since the interconnect 16 is removable from the carrier 10, other interconnect configurations may be provided for other die bond pad configurations (e.g., peripheral, array, edge connect, lead over chip (LOC)). This permits carriers to be "universal" rather than "dedicated" to a particular die configuration.

Each contact member 86 is formed as a raised mesa or pillar that projects vertically upward from a surface of the substrate 84. In addition, each contact member 86 includes one or more raised projections 94 adapted to penetrate into the bond pads 90 of the die 14 and to pierce the native oxide on the bond pads 90 to form an ohmic contact. At the same time, a top surface of the contact member 86 limits the penetration depth of the raised projections 94 into the bond pad 90. The height of the raised projections 94 is selected to be less than the thickness of the bond pad 90. A thickness of typical aluminum bond pads is on the order of 1 $\mu$m or less, so that the projections 94 are on the order of 2 Å to 5000 Å. This arrangement permits a metal oxide layer of the bond pad 90 to be pierced while at the same time minimizing damage to the bond pad 90. The raised projections 94 of the contact member 86 can be formed as elongated pyramids with flat tops, as shown, or as knife edges, sharp apexes, conical points or other suitable piercing structures.

Each contact member 86 includes an electrically conductive layer 96 formed of a metal or metal-silicide layer. The conductive layer 96 for each contact member 86 is connected to a conductive trace 88. The conductive layers 96 and conductive traces 88 are insulated from the silicon substrate 84 by an insulating layer 98 (e.g., SiO$_2$).

A suitable process for forming the contact members 86 substantially as shown is disclosed in U.S. Pat. No. 5,326,428 entitled "Method For Testing Semiconductor Circuitry For Operability And Method Of Forming Apparatus For Testing Semiconductor Circuitry For Operability", which is incorporated herein by reference. Another suitable process is disclosed in U.S. Pat. No. 5,483,741, entitled "Method For Fabricating A Self Limiting Silicon Based Interconnect For Testing Bare Semiconductor Dice."

Figure 6B:
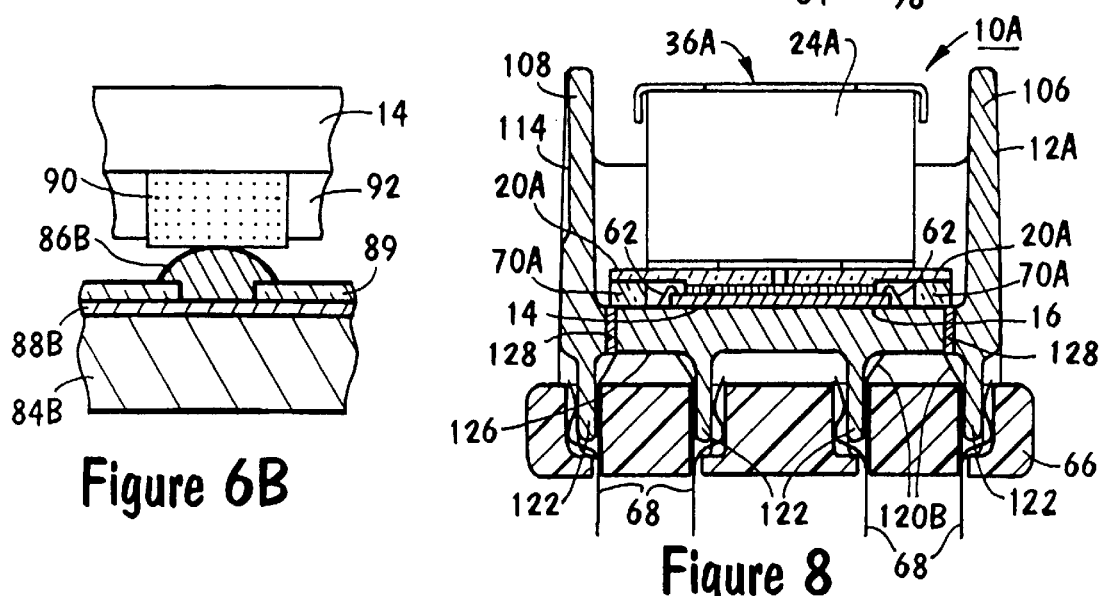
FIG. 6B is an enlarged cross sectional view equivalent to FIG. 6A showing an alternate embodiment interconnect formed with a microbump contact member.

Alternately as shown in FIG. 6B, an alternate embodiment interconnect can be formed with microbump contact members 86B. Microbump contact technology, which is used for Tape Automated Bonding (TAB) employs a nonconductive and electrically insulating tape 89 (e.g., polyimide) having a metallic foil (e.g., Cu) attached thereto. The foil is patterned and etched to form conductive traces 88B. Holes are etched through the tape 89 in contact with the conductive traces 88B. The contact members 86B are formed as metal bumps (e.g., Ni, Au, solder, Cu) in contact with the conductive traces 88B. The contact member 86B/tape 89/trace/88B assembly is mounted on a rigid substrate 84B (e.g., silicon ceramic).

Alternate Embodiment

Figure 8:
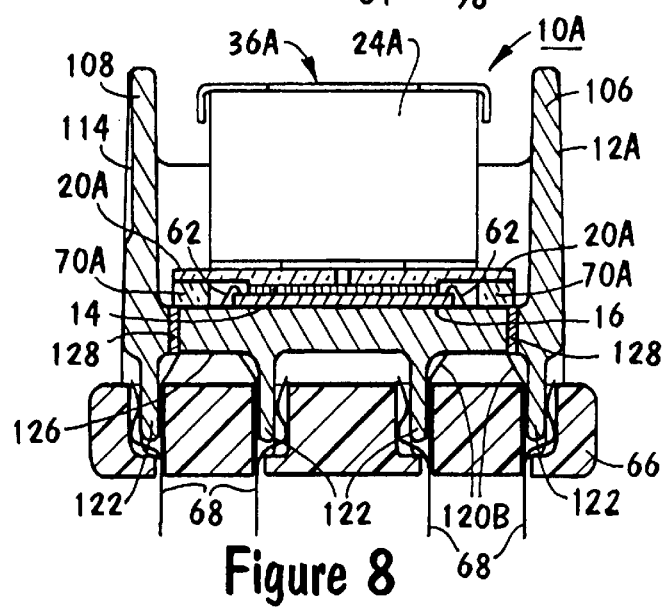
FIG. 8 is a cross sectional view taken along section line 8—8 of FIG. 9.
Figure 7:
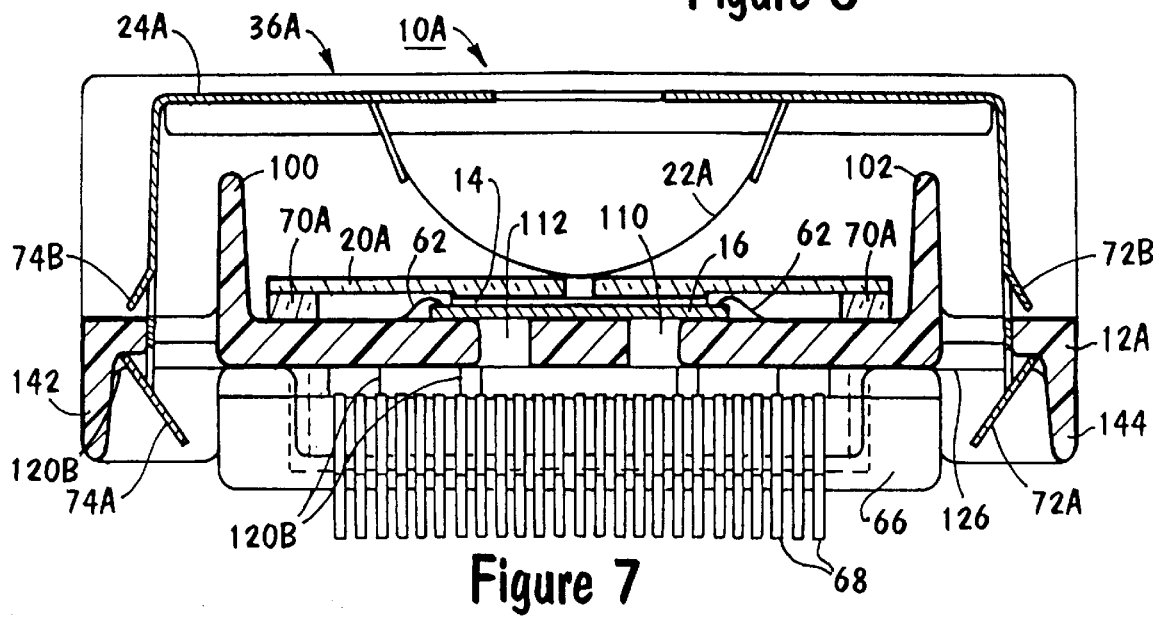
FIG. 7 is a cross sectional view taken along section line 7—7 of FIG. 9 showing an alternate embodiment carrier having molded 3-D conductive lines and external contacts.
Figure 9:
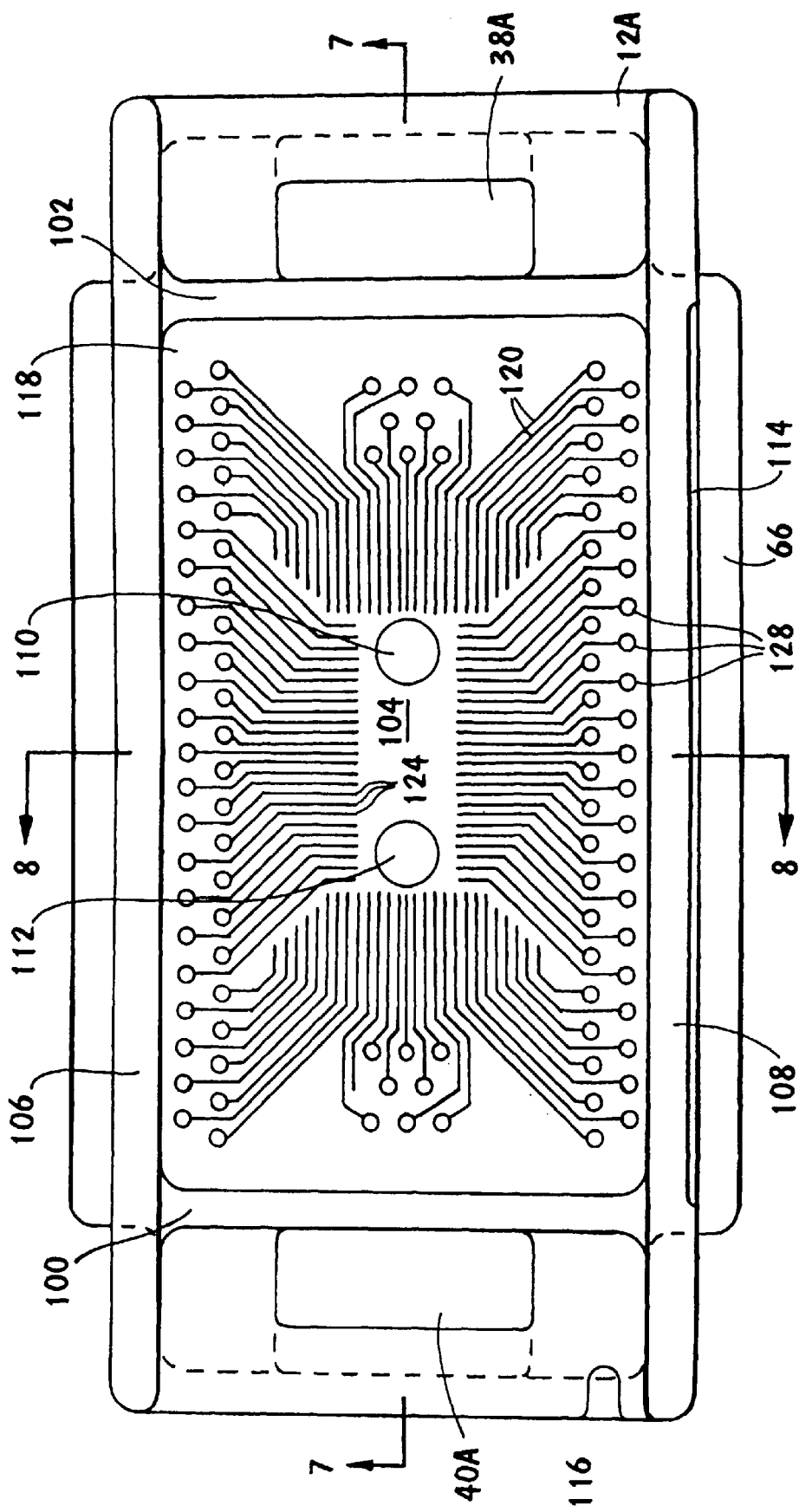
FIG. 9 is a plan view with parts removed of the alternate embodiment carrier shown with the force distribution mechanism and interconnect components removed.

Referring now to FIGS. 7–9, an alternate embodiment carrier 10A constructed in accordance with the invention is shown. The carrier 10A is characterized by an injection molded plastic base 12A formed with plated circuitry. The plated circuitry is fabricated using a process that combines electroless and electrolytic metal plating, photolithographic patterning and wet chemical etching. This fabrication technique for electronic components is sometimes referred to as molded 3-D fabrication because the molded components can include metal filled vias for interconnecting the circuitry in a z direction. The circuit patterns are thus formed in the x, y and z directions and are integrated into the structure of the component.

As shown in FIGS. 7 and 8, the carrier 10A includes a carrier base 12A adapted to retain a die 14 for testing; a temporary interconnect 16 adapted to establish electrical communication between the die 14 and the carrier base 12A; and a force distribution mechanism 36A comprising a pressure plate 20A, a spring 22A and a bridge clamp 24A for biasing the die 14 against the interconnect 16 with an evenly distributed biasing force. Additionally, in these views the carrier 10A is shown coupled to a socket 66 which is not a component of the carrier 10A.

The carrier base 12A is injection molded out of a high temperature glass filled plastic. Suitable plastics include polyetherimide (PEI), polyethersulfone (PES), polyarylsulfone (PAS), polyphenylene sulfide (PPS), liquid crystal polymer (LCP) and polyether-ether ketone (PPEK). The injection molding process forms the carrier base 12A into the desired shape. At the same time openings or vias are molded into the carrier base 12A to provide conduits for interlevel connection of the metallized circuitry formed on the different surfaces. During a subsequent metallization process various circuit patterns are formed on different surfaces of the carrier base 12A and interconnected by filling the openings with a conductive metal.

FIG. 9 shows the carrier base 12A with the force distribution mechanism 36A and the interconnect 16 removed. The carrier base 12A, viewed from above, is generally rectangular in shape. The carrier base 12A includes vertically projecting sidewalls 100 and 102; a back wall 106; and a front wall 108. The walls of the carrier base 12A are formed as flanges to form an enclosed or recessed interior portion that is open from above. This recessed arrangement protects the die 14 and the force distribution mechanism 36A from mechanical damage during the test procedure. A flat mounting surface 104 is formed within the recessed interior portion of the carrier base 12A for mounting the interconnect 16. A pair of extraction holes 110, 112 are formed through the carrier base 12A to the mounting surface 104 for removing and installing the interconnect 16. The carrier base 12A also includes a pair of elongated through slots 38A, 40A for mounting the force distribution mechanism 36A substantially as previously disclosed.

The front wall 108 of the carrier base 12A includes a recessed surface 114 that is sized to accept a bar code label (not shown). The bar code label can be used to track each die under test through the testing procedure. The recessed surface 114 protects the bar code from damage during testing and handling. The carrier base 12A also includes a molded indentation 116 that functions as an indicator of the orientation of the carrier 10A and die 14. By way of example, the molded indentation 116 can be formed on the side of the carrier base 12A that is aligned with a designated pin #1. In addition, as shown in FIGS. 7 and 8, the carrier base 12A includes a recessed bottom surface 126 having four molded contact ribs 122. The contact ribs 122 are protected by molded flanges 142, 144 (FIG. 7).

After the carrier base 12A is formed by injection molding, a pattern of conductive traces 120 is formed on an upper surface 118 (FIG. 9) of the carrier base 12A. In a similar manner, a pattern of conductive traces 120B (FIG. 7) are formed on the bottom surface 126 of the carrier base 12A and terminate on a surface of the contact ribs 122. Metal filled vias 128 (FIGS. 8 and 9) electrically connect the conductive traces 120 on the upper surface 118 to the conductive traces 120B on the bottom surface 126 of the carrier base 12A. The conductive traces 120 and 120B provide a conductive path from the conductive traces 88 (FIG. 5) on the interconnect 16 to the clips 68 (FIG. 8) on the mounting socket 66. The clips 68 on the mounting socket 66 are in electrical communication with external test equipment.

Furthermore, as shown in FIGS. 7 and 8, the conductive traces 120 on the interior surface 118 of the carrier base 12A are wire bonded to the interconnect 16 using wires 62. This is similar to the wire bonding arrangement for the interconnect 16 previously described for carrier 10. A terminal end 124 (FIG. 9) of the conductive traces 120 provides a wire bonding site on the carrier base 12A equivalent to the bonding pads 60 (FIG. 1) previously described for carrier base 12.

The conductive traces 120 and 120B are formed of a conductive metal such as copper, nickel, gold or silver using a 3-D plating process. One suitable 3-D plating process is described in U.S. Pat. No. 4,985,116 which is incorporated herein by reference. By way of example for forming the conductive traces 120 on the upper surface 118 of the carrier base 12A, a conductive metal is deposited over substantially the entire upper surface 118. This can be done using an electroless plating process. The deposited metal is electroplated with a layer of resist which is dried and baked. A mask is then placed over the resist and pulled tight using a vacuum. The resist is exposed through the mask and developed. Exposed metal is stripped using a suitable wet etchant. The resist is then stripped leaving the conductive traces 120.

The conductive traces 120B on the bottom surface 126 of the carrier base 12A can be formed in substantially the same manner. The metal filled vias 128 for interconnecting the conductive traces 120 and 120B can be formed by electroless deposition at the same time or prior to formation of the conductive traces 120 and 120B.

The force distribution mechanism 36A for the carrier 10A is constructed substantially as previously described for carrier 10. In addition, a sealing member 70A is included with the carrier 10A to prevent air borne contaminants from contacting the die 14 during the test procedure. The sealing member 70A can be formed out of a soft material such as silicone in a peripheral configuration that completely surrounds the die 14. With a sealing member 70A, the pressure plate 20A is appropriately sized for mating engagement with the sealing member 70A.

Some other design considerations and advantages of the carrier 10A are as follows:

1. There are no protruding mechanical pins or leads that can be bent or damaged during handling.
2. The molded plastic construction reduces the number of parts and tooling costs.
3. The metal plated conductive traces 120 (FIG. 9) can be closely spaced to match bond pads on semiconductor dice (e.g., 0.010 inch pitch).
4. The metal plated conductive traces 120B on the backside of the carrier can fan out to an increased spacing (e.g., 0.050 inch pitch) for use with a standard test socket (e.g., socket 66 FIG. 8). An interconnection scheme such as a leadframe or TAB tape is thus not required.
5. Molded construction permits the overall dimensions of the carrier 10A to be small in relation to the large number of input/output lines.
6. The bridge clamp 24A, spring 22A and pressure plate 20A can be grounded by contact with a grounding trace formed on the carrier base 12A.
7. The upper surface 118 and bottom surface 126 of the carrier base 12A are recessed so that the die, force distribution mechanism 36A and contact ribs 122 are protected.
8. The sealing member 70A prevents air borne contamination.
9. The photo-imaging metallization process used to form the conductive traces 120, 120B allows very simple changes in the mask to effect circuitry changes.
10. The physical outline and protected features of the carrier 10A permit handling by automated apparatus.
11. The contact ribs 122 function in a manner similar to printed circuit board edge connectors. In addition, the contact ribs 122 stiffen the carrier base 12A to resist bending moment applied by the force distribution mechanism 36A. Moreover, the ribs 122 can be offset or unequally spaced from one another to facilitate a proper insertion orientation with the test socket 66.
12. Optionally a surface mount capacitor can be connected to select conductive traces 120 to suppress voltage spikes and noise.
13. Optionally, the area of the carrier base 12A in contact with mounting tabs 72A, 74A can be plated to prevent wear and to provide a conductive path for grounding the bridge clamp 24A.
14. Optionally, the bridge clamp 24A can include mounting tabs 72B, 74B to limit axial movement of force distribution mechanism 36A.

Assembly

The assembly of carrier 10 and 10A is substantially the same, however, the assembly procedure is described with reference to carrier 10. Prior to the assembly procedure, the interconnect 16 is placed in the cavity 26 and wire bonded to the carrier base 12. Briefly, during the assembly procedure, the die 14 is attached to the pressure plate 20, and the die 14 and interconnect 16 are aligned using optical alignment techniques. The pressure plate 20 and die 14 are then lowered to place the die 14 into contact with the interconnect 16. At the same time the bridge clamp 24 is secured to the carrier base 12 for biasing the die 14 and interconnect 16.

During the assembly procedure, the bond pads 90 (FIG. 6) on the die 14 are aligned with the contact members 86 on the interconnect 16. This can be accomplished using alignment techniques similar to those used for flip chip bonding. Flip chip bonding refers to a process wherein a semiconductor die is placed face down on a substrate, such as a printed circuit board, and the bond pads on the die are bonded to connection points on the substrate. Tools for flip chip bonding are sometimes referred to as aligner bonders. An aligner bonder and method of optical alignment for flip chip bonding are described in U.S. Pat. No. 4,899,921 to Bendat et al, entitled "Aligner Bonder" which is incorporated herein by reference. Such an aligner bonder is available from Research Devices of Piscataway, N.J.

In the present case an aligner bonder may be modified to provide an assembly apparatus for use in assembling the carrier 10. FIG. 10 illustrates the alignment step of the assembly procedure using such an apparatus. With reference to FIG. 10, the assembly tool 34 is connected to a vacuum source (not shown). The assembly tool 34 is adapted to attach the die 14 to the pressure plate 20 by directing a vacuum through the opening 30 in the pressure plate 20. The assembly tool 34 is movable along the z-axis in either direction. An optical probe 130 is movable from one location to another to explore aligned portions of the die 14 and interconnect 16. The optical probe 130 is in light communication with optics 132 and video cameras 134, 136 for providing video images of the opposing surfaces. These images are displayed on a display monitor 138.

The carrier 10 is supported by an adjustable support 140 movable along x, y and z axes, in a rotational direction θ (theta) and in angles of inclination ø and Ψ. By moving the adjustable support 140 as required, the bond pads 90 on the die 14 can be aligned with the contact members 86 on the interconnect 16. In addition, by using reference marks, adjustment of angles of inclination ø and Ψ can be used to achieve parallelism of the surfaces of the die 14 and interconnect 16.

Following alignment of the die 14 and interconnect 16, the assembly tool 34 is adapted to move the die 14 and pressure plate 20 along the z axis towards the interconnect 16 to place the contact members 86 of the interconnect 16 into contact with the bond pads 90 of the die 14. The assembly tool 34 is also adapted to exert a contact force of a predetermined magnitude on the pressure plate 20 and die 14 so that the contact members 86 on the interconnect 16 penetrate the bond pads 90 to establish an electrical connection that is low resistance and ohmic.

As the die 14 is placed in contact with the interconnect 16, the bridge clamp 24 and spring 22 are attached to the carrier base 12. The assembly tool 34 can include mechanisms (not shown) to facilitate assembly of the bridge clamp 24 and spring 22 with the carrier base 12 as the die 14 and interconnect 16 are placed in contact. The bridge clamp 24 is then secured to the carrier base 12. A spring force is exerted by the spring 22 and evenly distributed across the die 14 by the pressure plate 20. The size, material and structure of the spring 22 is selected to provide a predetermined biasing force.

Thus the invention provides a carrier adapted to test a discrete, unpackaged semiconductor die in the manufacture of known good die. In each of the embodiments, the carrier includes an interchangeable interconnect and a force distribution mechanism adapted to bias the die against the interconnect with an evenly distributed force. Moreover, an electrical connection is formed with bond pads on the die using contact members formed on the interconnect with a self limiting feature.

While the invention has been described with reference to certain preferred embodiments, as will be apparent to those skilled in the art, certain changes and modifications can be made without departing from the scope of the invention as defined by the following claims.

What is claimed is:

1. A carrier for testing a semiconductor die comprising:
   a molded plastic base comprising a first surface, a second surface and a molded plastic rib on the second surface configured for insertion into a socket;
   a first conductive trace on the rib;
   a second conductive trace on the first surface;
   a conductive via in the base electrically connecting the first conductive trace and the second conductive trace;
   an interconnect on the first surface comprising a substrate and a contact member on the substrate in electrical communication with the first conductive trace and configured to electrically contact a contact location on the die; and
   a force mechanism on the base configured to bias the interconnect and the die together,
   the rib configured to stiffen the base and to resist a bending moment applied to the base by the force mechanism.

2. The carrier of claim 1 wherein the force mechanism comprises a plate for contacting the die, a spring for biasing the plate against the die, and a sealing member between the plate and the first surface for sealing around the die.

3. The carrier of claim 1 wherein the base comprises a plurality of walls projecting from the first surface and the force mechanism is protected by the walls.

4. The carrier of claim 1 wherein the base comprises a plurality of flanges projecting from the second surface and the rib is protected by the flanges.

5. The carrier of claim 1 wherein the base comprises a material selected from the group consisting of polyetherimide (PEI), polyethersulfone (PES), polyarylsulfone (PAS), polyphenylene sulfide (PPS), liquid crystal polymer (LCP) and polyether-ether ketone (PPEK).

6. The carrier of claim 1 further comprising a recess in the base configured for mounting a label.

7. The carrier of claim 1 further comprising an indentation on the base configured to provide an indicator of the orientation of the die and the carrier.

8. The carrier of claims 1 further comprising an opening through the base to the first surface for removing the interconnect.

9. A carrier for testing a semiconductor die comprising:
   a molded plastic base comprising a surface, and a plurality of extended contacts comprising metal plated molded plastic ribs configured for electrical communication with a test socket, the ribs configured to facilitate orientation of the base in the socket and to resist bending of the base;
   a plurality of conductive traces on the surface;
   a plurality of conductive vias in the traces and the external contracts;
   an interconnect on the surface comprising a substrate and a plurality of contact members on the substrate in electrical communications with the conductive traces and configured to electrically contact a plurality of contact locations on the die; and
   a force mechanism on the base configured to bias the interconnect and the die together.

10. The carrier of claim 9 wherein the ribs are offset relative to one another.

11. The carrier of claim 9 wherein the ribs are unequally spaced relative to one another.

12. The carrier of claim 9 wherein the ribs are configured to resist a bending moment applied by the force mechanism to the base.

13. The carrier of claim 9 wherein the base comprises a plurality of flanges and the ribs are protected by the flanges.

14. A carrier for testing a semiconductor die comprising:
   a molded plastic base comprising a surface and an external contact comprising a molded plastic rib and a first conductive trace on the rib configured for electrical communication with a testing circuit;
   a second conductive trace on the surface;
   a conductive via in the base electrically connecting the first conductive trace and the second conductive trace;
   an interconnect on the surface comprising a substrate and a contact member on the substrate in electrical communication with the second conductive trace and configured to electrically contact a contact location on the die; and a force mechanism on the base configured to bias the interconnect and the die together, the mechanism comprising a plate for contacting the die and a sealing member between the plate and the surface substantially surrounding the die;

the rib configured to stiffen the base and to resist a bending moment applied to the base by the force mechanism.

15. The carrier of claim 14 wherein the sealing member comprises silicone.

16. The carrier of claim 14 wherein the sealing member and the plate have mating peripheral configurations.

17. The carrier of claim 14 wherein the force mechanism comprises a clamp attached to the base and a spring attached to the clamp for biasing the plate and the die against the interconnect.

18. The carrier of claim 14 wherein the carrier comprises a plurality of external contacts.

19. A carrier for testing a semiconductor die comprising:

a molded plastic base comprising a first surface, a plurality of walls projecting from the first surface, a second surface and an external molded plastic rib on the second surface configured for insertion into a socket and to strengthen the base to resist bending thereof;

a first conductive trace on the rib;

a second conductive trace on the first surface;

a conductive via in the base electrically connecting the first conductive trace and the second conductive trace;

an interconnect on the first surface comprising a substrate and a contact member on the substrate in electrical communication with the first conductive trace and configured to electrically contact a contact location on the die; and a force mechanism on the base configured to bias the interconnect and the die together, the mechanism comprising a clamp attached to the base and protected by the walls, a spring attached to the clamp, a plate in contact with the spring and the die, and a sealing member between the plate and the first surface.

20. The carrier of claim 19 further comprising a plurality of flanges on the second surface configured to protect the rib.

21. The carrier of claim 19 the rib is configured to resist a bending moment applied by the force mechanism to the base.

22. The carrier of claim 19 wherein the first conductive trace fans out on the second surface.

* * * * *